United States Patent [19]
Marks et al.

[11] Patent Number: 4,934,967
[45] Date of Patent: Jun. 19, 1990

[54] SOCKET FOR PIN GRID ARRAY

[75] Inventors: Richard L. Marks, Mechanicsburg, Pa.; Roger L. Thrush, Clemmons, N.C.

[73] Assignee: AMP Incorporated, Harrisburg, Pa.

[21] Appl. No.: 302,065

[22] Filed: Jan. 24, 1989

Related U.S. Application Data

[63] Continuation of Ser. No. 132,307, Dec. 15, 1987, abandoned.

[51] Int. Cl.⁵ .............................................. H01R 11/22
[52] U.S. Cl. ...................... 439/856; 439/751; 439/81
[58] Field of Search ............... 439/869, 870, 873, 733, 439/741, 743, 746–748, 751, 821, 823, 834, 842, 843, 851–858, 78, 55, 80–83, 68–75

[56] References Cited

U.S. PATENT DOCUMENTS

| | | | |
|---|---|---|---|
| 3,609,640 | 9/1971 | Longenecker et al. | 339/91 R |
| 3,659,254 | 4/1972 | Cartwright | 439/751 |
| 3,718,895 | 2/1973 | Reynolds et al. | 339/258 R |
| 3,824,557 | 7/1974 | Mallon | 339/258 R |
| 3,858,153 | 12/1974 | Coller et al. | 439/82 |
| 3,955,877 | 5/1976 | Cobaugh et al. | 339/258 P |
| 3,992,076 | 11/1976 | Gluntz | 339/258 R |
| 4,342,495 | 8/1982 | Bennet et al. | 439/907 |
| 4,480,386 | 11/1984 | Adams | 439/857 |
| 4,498,725 | 2/1985 | Bright et al. | 339/176 M |
| 4,552,422 | 11/1985 | Bennett et al. | 339/17 CF |
| 4,605,277 | 8/1986 | DeFilippis et al. | 339/252 R |
| 4,606,599 | 8/1986 | Grant et al. | 439/682 |
| 4,620,757 | 11/1986 | Thevenaz | 339/17 C |
| 4,648,669 | 3/1987 | Marks et al. | 339/258 |
| 4,679,318 | 7/1987 | Bright | 79/840 |
| 4,707,052 | 11/1987 | Bouley | 439/83 |
| 4,784,622 | 11/1988 | Senor | 439/853 |

FOREIGN PATENT DOCUMENTS

| | | |
|---|---|---|
| 2529023 | 12/1983 | France . |
| 2579834 | 10/1986 | France . |
| 1087299 | 10/1964 | United Kingdom . |

Primary Examiner—David Pirlot
Attorney, Agent, or Firm—Eric J. Groen

[57] ABSTRACT

An electrical socket for interconnecting a pin grid array to a printed circuit board includes an insulative housing having a plurality of apertures extending between upper and lower faces, the socket apertures have disposed therein, terminals for receiving the pins of the pin grid array in an electrically interconnected condition. A pin receiving portion of the terminal includes a circular band portion with resilient contact arms extending downwardly therefrom. The band portion includes a seam which allows for the expansion of the seam to relieve the stress in the band cuased by the deflection of the contact arms. The center of the circular band portion is also moveable to allow the pin receiving portion to realign itself to allow the reception of misaligned pins.

5 Claims, 6 Drawing Sheets

Fig. 6

SOCKET FOR PIN GRID ARRAY

This application is a Continuation of application Ser. No. 07/132,307 filed Dec. 15, 1987, now abandoned.

BACKGROUND OF THE INVENTION

1. Field of the Invention

The subject invention relates to sockets for soldering to printed circuit boards which can accept a pin grid array (PGA) having a plurality of pins.

2. Description of the Prior Art

U.S. Pat. No. 4,498,725; U.S. Pat. No. 4,648,669; and U.S. Pat. No. 4,679,318 relate generally to sockets for pin grid arrays.

Both U.S. Pat. No. 4,648,668 and U.S. Pat. No. 4,498,723 relate to a pin grid array socket which is generally known as a zero insertion force socket. Each of those patents receive a pin grid array and a mechanism is included with the socket which moves the pin grid array into registration with the socket contacts and into electrical engagement therewith.

U.S. Pat. No. 4,679,318 relates to a socket for a pin grid array which is not zero insertion force and the terminals include opposed contact portions which extend upwardly from a strap or bight portion for receiving a pin downwardly therethrough. A shortcoming of this terminal is that the forces to overcome the spreading of the contact arms to accept the pin, referred to as insertion force, are great due to the dynamics resultantly created by the contact configuration.

Figure 1:
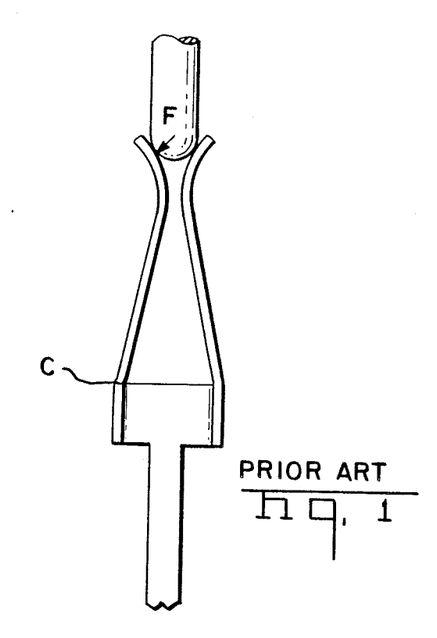
FIG. 1 shows the disposition of a terminal and pin of a prior art socket.

With reference to FIG. 1, the terminal of U.S. Pat. No. 4,679,318 is depicted where, the registration of the terminal with respect to the pin is shown, and the pin is shown poised for receipt within the terminal and in initial contact with the contact arms. At the moment of contact between the pin and the contact arms, a resultant force F is imposed on each of the contact arms normal to the point of contact.

Figure 2:
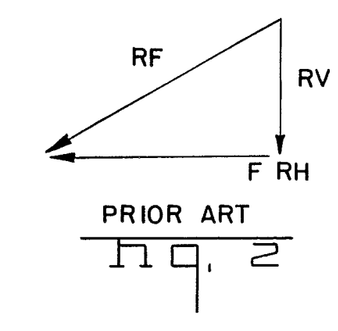
FIG. 2 is a diagrammatical view of the resultant force of the pin on the terminal of the prior art.

Referring now to FIG. 2 shows that the force imposed on the contact arms includes two components, a vertical component $F_V$ and a horizontal component $F_H$. Given that the contact arms will rotate about the interconnection between the contact arms and the strap at a point such as C, the vertical component $F_V$ will impose a clockwise moment on the contact arms, with respect to point C, and will attempt to pinch the contact arms closed. Admittedly, the horizontal component $F_H$ is larger than the vertical $F_V$ and the resultant moment will be counterclockwise about point C, and will open the contact arms and accept the pin. However, the vertical component of the force is doing negative work by attempting to close the contact arms, therefore, the overall force must be increased to achieve a horizontal force large enough to open the contact arms. As the number of pins on the PGAs increases, so will the total insertion force required to insert the PGAs within their associated sockets, which could resultantly damage the PGAs.

Furthermore, the terminal shown in U.S. Pat. No. 4,679,318 appears to use the strap portion and the side walls for retention of the terminal within the respective apertures, which disallows the expansion of the strap portion.

Furthermore, the terminals in U.S. Pat. No. 4,679,318 appear to be box-shaped and are not capable for use in a high density array.

SUMMARY OF THE INVENTION

The state of the art in pin grid arrays has a recent requirement for higher density spacing requirements for the pins on the array. It is believed that no such socket terminal is commercially available which can accommodate these increases in pin density.

Therefore, it is an object of the instant invention to design a terminal for a pin grid array socket which is capable for use in such high density arrays.

It is a further object of the invention to minimize the insertion force of the pin grid array.

It is a further object of the invention to include a centering feature of the terminals such that misaligned pins of the pin grid array will align with the pin receiving area of the terminal.

The objects of the invention were met by defining the socket as an insulating housing having an upper carrier receiving face and a lower printed circuit board receiving face where the housing has a plurality of apertures extending between the two housing faces. A plurality of electrical terminals are disposed within the apertures and include a base portion which includes an integral pin receiving portion for electrical interconnection with the carrier pins and a tail portion which extends beyond the printed circuit board receiving face for electrical connection with the printed circuit board.

Preferably, the pin receiving portion includes a circular band portion and has resilient contact portions extending therefrom and downwardly into the aperture towards the printed circuit board receiving face.

Preferably, the circular band portion is profiled smaller than its surrounding through hole which allows the pin receiving portion to find its center.

Preferably, the band portion has a seam which allows the band portion to expand thereby alleviating some of the stresses in the contact arms.

The preferred embodiment of the invention will now be described in view of the following figures.

BRIEF DESCRIPTION OF THE DRAWINGS

FIG. 3A shows a first embodiment of the socket of the instant invention.

FIG. 3B shows a second embodiment of the socket of the instant invention.

FIG. 6 is a side view of the terminal of the instant invention.

DETAILED DESCRIPTION OF THE PREFERRED EMBODIMENT

The state of the art in pin grid arrays has recently developed a requirement for higher density arrays, which results in the two patterns of sockets shown in FIGS. 3A and 3B. The first pattern is a square pattern where the distances between the pins is 0.050 inches. The second pattern is known as an "interstitial" pattern where, four pins are provided on a square pattern spaced on 0.100 inch centers and a fifth pin is included centered intermediate every four pins. It is believed that no such socket is commercially available which would accommodate either of the two configurations of aforementioned pin grid arrays.

I have invented a socket, and the terminals therefore, which are capable of accommodating the pin grid arrays which are configured as described above.

Referring first to FIGS. 3A and 3B, the socket 2 of the instant invention includes an insulative housing 4 with a plurality of apertures 6 extending through the housing 4. The housing 4 includes an upper or first face, such as 8, and a lower printed circuit board receiving or second face 16. As discussed above, two designs of sockets are included, the first shown in FIG. 3A where the distances "a" and "b" are 0.050 inches and the second embodiment shown in FIG. 3B where the distances "c" and "d" are 0.100 inches with a fifth aperture 6 intermediate every four apertures, the second embodiment being called the interstitial configuration.

Figure 4:
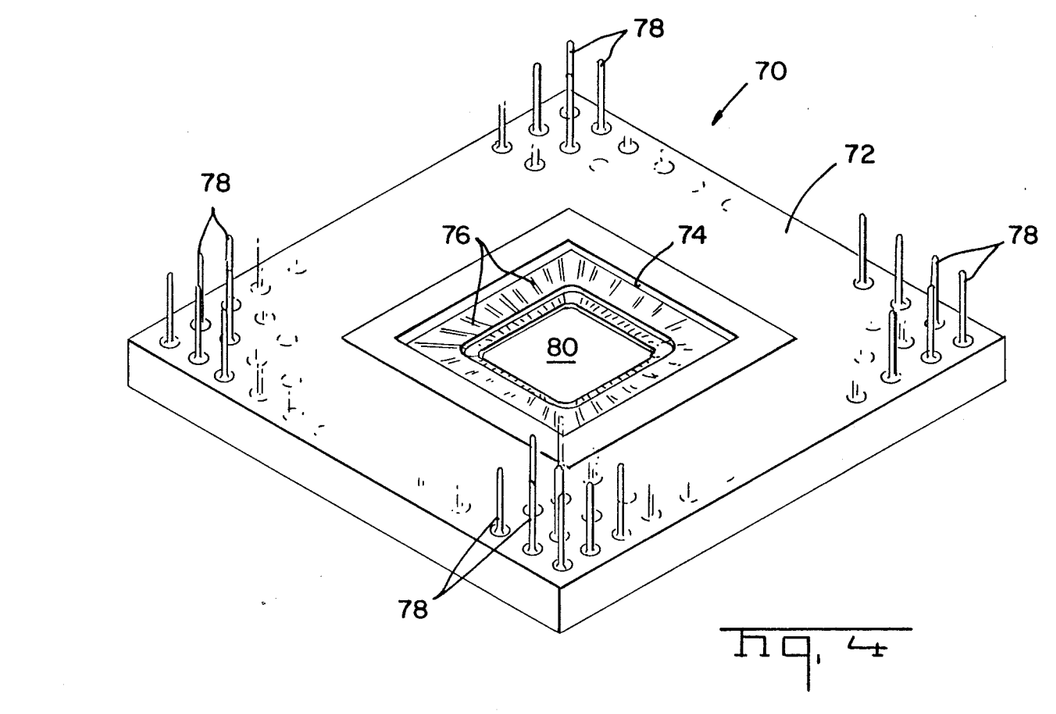
FIG. 4 shows a conventional pin grid array.

In either event, the socket will be profiled for receiving a pin grid array, such as that shown in FIG. 4 as 70, where the pin grid array 70 includes a carrier receiving body, such as 72, having a plurality of pins configured in a dense array as mentioned above. The pin grid array 70 further comprises a chip receiving pocket, shown as 74, which receives the leadless chip 80 in a protective manner and serves as a nest in which the chip 80 can be brazed, epoxied, or otherwise attached. The plurality of traces, such as 76, are included on the insulative carrier member 72 and are defined in a pattern extending downwardly into the chip receiving pocket for electrical interconnection with the leadless chip. The traces 76 extend outwardly from the chip receiving pocket 74 and are electrically interconnected to respective pins 78 of the chip receiving carrier.

Figure 5:
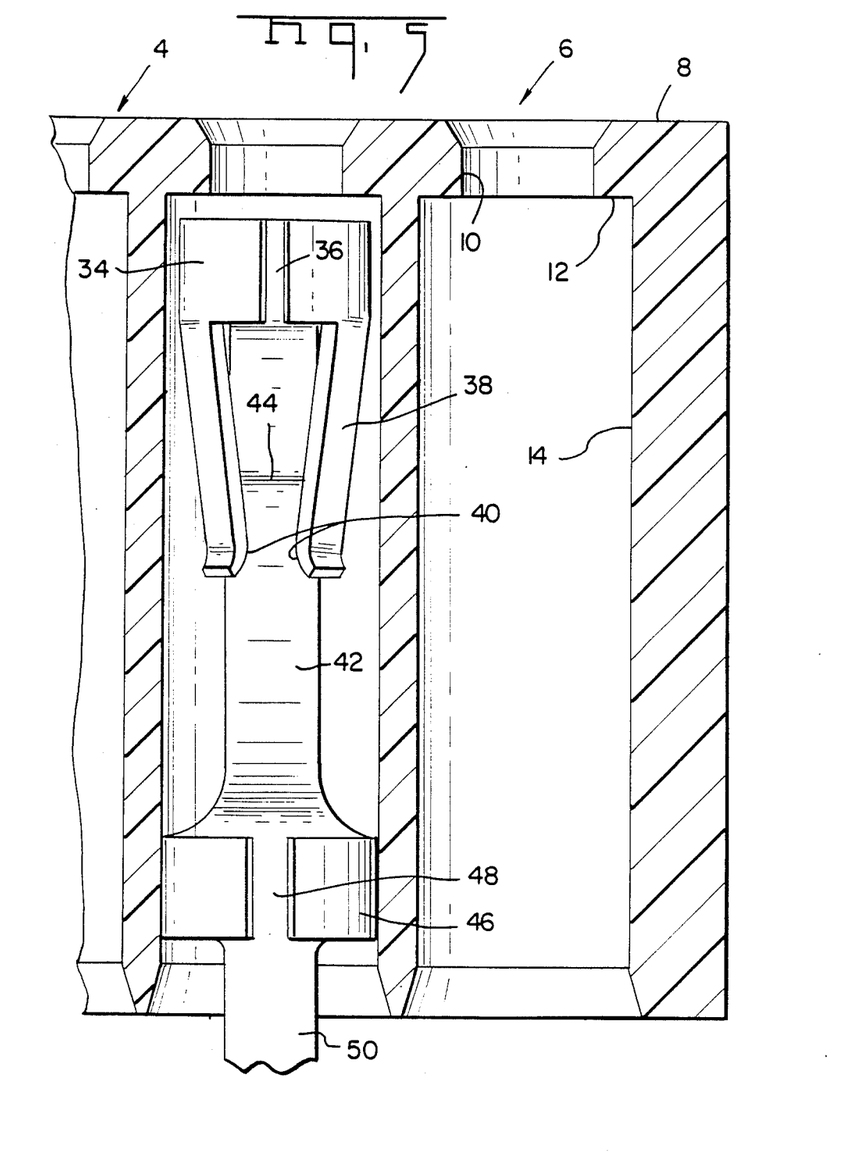
FIG. 5 is a cross-sectional view through lines 5—5 of FIG. 4.

With reference now to FIG. 5 which is a cross-sectional view through lines 5—5 of FIG. 3A, the insulative housing 4 generally includes an upper carrier receiving face 8 and a lower printed circuit board receiving face 16 with a plurality of pin receiving apertures 6 extending between the two faces. Adjacent the carrier receiving face is a pin receiving diameter 10 which communicates with an inner diameter 14 of the aperture 6. Each of the pin-receiving cavities thus has a reduced diameter pin-receiving opening at the surface 8 and a uniform diameter portion 14, having a diameter D, which extends from shoulder 12 substantially to the surface 16. The interface between the pin receiving diameter 10 and the inner diameter 14 defines a downwardly facing shoulder 12.

With reference to FIGS. 5 and 6, a plurality of terminals are inserted within the insulative housing 4 within the apertures 6 and each of the terminals generally includes a pin receiving portion 32, a retaining band 46, and a printed circuit board leg, such as 50.

Figure 7:
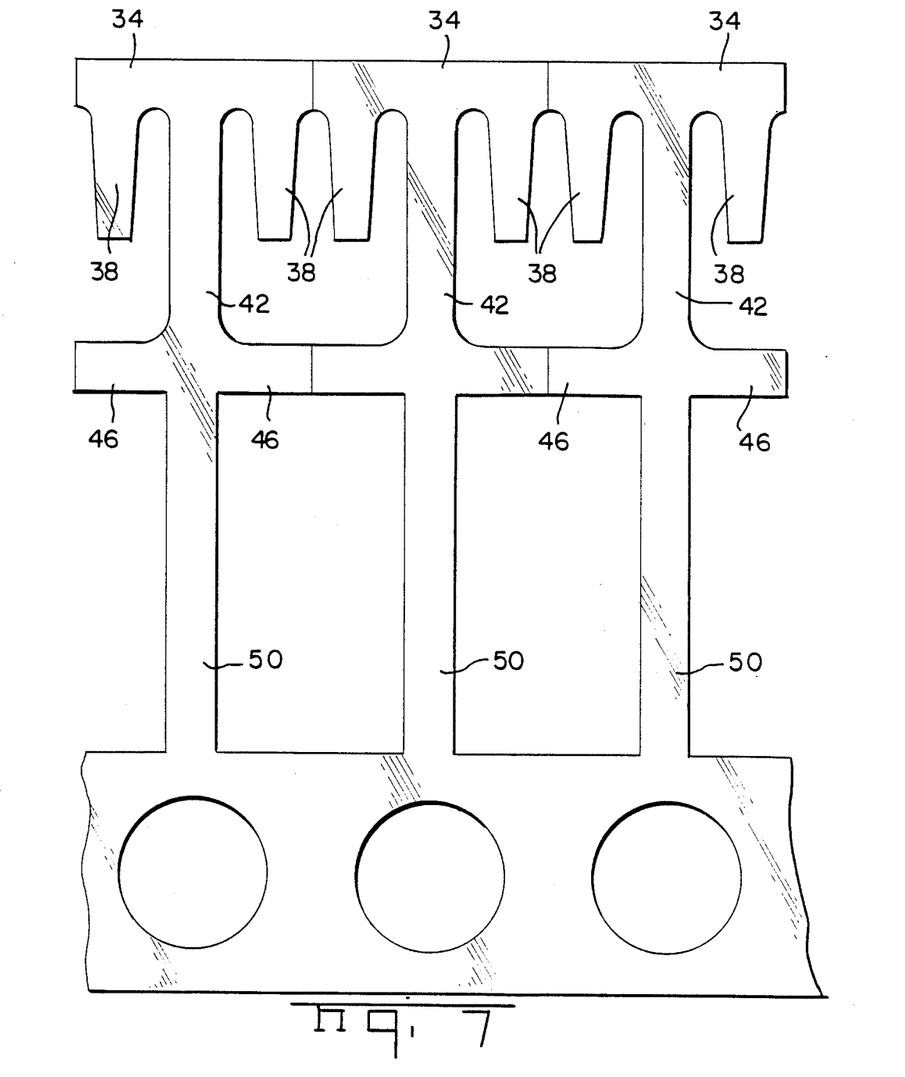
FIG. 7 is a top plan view of the stamped blank of the instant invention.

The pin receiving portion 32 includes a circular first band, such as 34, and further includes contact arms, such as 38, extending from the band. The terminals are stamped and formed from a flat blank, as shown in FIG. 7. Thus, when the blank is rolled to form the circular band 34, a seam 36 is defined. Each of the contact arms 38 is inwardly directed towards the center of the circular band portion 34. The contact arms 38 are also formed at their ends with radiused portions 40 which form contact points. As shown in FIG. 6, a strap portion 42 extends from the pin receiving portion and the strap portion is inwardly deflected to define a further contact point. A second circular band portion 46 is also included as a retention means for the terminal within the aperture 6 and is also stamped from a flat blank and then formed into a circular shape such as that shown in FIG. 5. The band portion includes a seam, such as 48. As shown in FIG. 5, the first band 34 has a transverse dimension or diameter which is less than D while the second band 46 would have a transverse dimension or diameter, in its relaxed state, which is greater than D. The second band is circumferentially compressed during insertion and bears against the surface of the uniform diameter portion 14 of the cavity. It will also be apparent from FIG. 5 that the first band 34 has a first or upper edge which is proximate to the shoulder 12 and has a second or lower edge which is relatively remote from the shoulder.

In an effort to place the terminals in the configuration shown in FIG. 1 where the spacing between the terminals is 0.050 inches on a side, the terminals must per se be less than 0.050 inches on the diameter. For this reason, two opposed contact arms cannot be utilized as the width of the arms enlarges the terminal to a profile which cannot fit on the 0.050 inch by 0.050 inch grid. Rather, three contact arms are utilized where each of the contact arms is approximately 120° apart. However, this makes each of the contact arms 38 so small that the stress at the juncture of the contact arms and the circular band portion 34 is high enough to plastically deform the contact arms, if the arms are not post heat treated. For this reason, the cylindrical band portion is not fixedly mounted in the housing and used as a retention feature as in other prior art sockets. Rather, the outer diameter of the cylindrical band portion 34 is smaller than the inner diameter 14 of the aperture 6, thus allowing radial expansion of the cylindrical band portion 34. The radial expansion of the cylindrical band portion 34 relieves much of the stress which is created in the contact arms 38 by the insertion of the pins. Furthermore, by having the outer diameter of the circular band portion 34 smaller than the inner diameter 14 of the aperture 6, the pin receiving portion of the terminal can move towards and away from the inner diameter 14 of the aperture 6 accounting for any misalignment of the pins into the pin receiving area.

Due to the increase in density of the array of pins, the total insertion force must be kept to a minimum. For this reason, the contact arms 38 extend downwardly from the cylindrical band portion 34 and are projected towards the printed circuit board receiving face 16 rather than extending upwardly towards the upper face 8 as in previous socket designs. It should be understood from the discussion relative to FIGS. 1 and 2 above that a resultant force will occur on the contact arms due to the insertion of the pin and that the resultant force will be normal to the plane on the contact arm. However, since the arms are extending downwardly, the vertical and horizontal components of the force on the contact arms 38 will both create a moment which open the contact arm, thereby reducing insertion force.

To further reduce the insertion force, the point of contact between the pins and the contact arms is staggered. As shown in FIG. 6, the point of contact 40 for the contact arms 38 is lower than the point of contact 44 for the strap portion 42. As the points of contact are axially offset, the force required to deflect those contact portions occurs in a stepped fashion such that the force required to open all three contact points does not occur simultaneously causing an additive force.

As the outer diameter of the cylindrical band portion 34 is smaller than the inner diameter 14 of the aperture 6, retention means independent of the pin receiving portion must be provided on the terminals. As shown in FIGS. 5 and 6, each of the terminals 30 further comprises a second cylindrical band portion 46 which has an outer diameter which is larger than the inner diameter 14 of the aperture 6. Thus, the circular band portion 46 becomes a circular spring which will store energy and attempt to radially expand, thereby retaining the terminals 30 within their associated apertures 6.

The above invention was described by way of preferred embodiment and should not be taken to limit the scope of the claims which follow.

We claim:

1. An electrical socket connector for interconnecting a plurality of pins to a printed circuit board, the socket connector comprising:
    an insulating housing having an upper carrier receiving face and a lower printed circuit board receiving face, the housing having a plurality of apertures extending between the two housing faces; and
    a plurality of electrical terminals disposed within the apertures, each terminal including a pin receiving portion, a strap portion, a retention portion and a tail portion, the strap portion interconnecting the pin receiving portion to the tail portion, the pin receiving portion being profiled for electrical interconnection with the pins of a pin grid array, and the tail portions extending beyond the printed circuit board receiving face for electrical connection with a printed circuit board; the pin receiving portion comprising an upper band portion which is stamped from a flat blank and formed to include an axially extending open seam, the upper band portion having a diameter which is smaller than a diameter of the aperture, the upper band being expandable within the aperture, the seam and the strap portion being substantially diametrically opposed from each other, the pin receiving portion further including at least two contact arms extending downwardly from a lower edge of the band portion with each of the contact arms being on opposite sides of the strap portion, although not diametrically opposed; the strap portion being inwardly directed at a position adjacent to the contact arms to form a further resilient contact portion in cooperation with the at least two contact arms, the strap portion also being resiliently deflectable relative to the retention portion, thereby allowing for lateral realignment of the upper band portion within the aperture.

2. The electrical socket of claim 1 wherein each of the contact arms is radially positioned 120° from the strap portion and on opposite sides of the strap portion.

3. An electrical socket connector for interconnecting a plurality of pins to a printed circuit board, the socket connector comprising:
    an insulating housing having an upper carrier receiving face and a lower printed circuit board receiving face, the housing having a plurality of circular apertures extending between the two housing faces; and
    a plurality of electrical terminals disposed within the apertures, each terminal including an elongate strap portion having upper and lower circular band portions formed integrally with side edges of the strap portion and each of the circular band portions extending generally transversely of the strap portion, the upper circular band portion comprising an axially extending open seam opposed from the strap portion, the upper circular band portion further including at least two resilient contact arms on opposite sides of the open seam and extending downwardly from a lower edge of the band portion, thereby forming contact surfaces, the contact arms being resiliently deflectable relative to the upper circular band, and the upper circular band portion being resiliently deflectable relative to the strap portion, the upper circular band and the resilient contact arms defining an integral pin receiving portion for electrical interconnection with one of the pins of a pin grid array, the lower circular band defining retention means for retaining the terminals within the respective apertures, the lower circular band being larger in a free state than the diameter of the circular apertures, thereby providing spring loaded retention of the terminals within the apertures; and a tail portion which is integral with the lower band portion and extending downwardly therefrom beyond the printed circuit board receiving face, the terminals being disposed within the apertures with the pin receiving portions being adjacent to the upper carrier receiving face and the tail portions extending through the printed circuit board receiving face for electrical connection with a printed circuit board.

4. A one piece stamped and formed sheet metal socket contact terminal which is contained in a cavity in a housing, the housing having oppositely facing first and second major surfaces, the cavity extending entirely through the housing from the first surface to the second surface, the cavity having a reduced diameter pin receiving opening on the first surface and having an interior shoulder adjacent to the first surface, the shoulder being directed towards the second surface, the cavity having a uniform diameter cylindrical portion having a diameter D which extends from the shoulder to the second major surface, the socket contact terminal being characterized in that:
    the socket contact terminal comprises first and second spaced-apart aligned generally cylindrical bands, a single strap extending between the bands, and two contact arms which extend from the first band towards the second band,
    the first band being in the uniform diameter portion proximate to the shoulder, the second band being in the uniform diameter portion proximate to the second surface, each of the bands having an axially extending open seam,
    the first band having a normal diameter which is less than the diameter D, the second band having a normal diameter which is greater than the diameter D, the second band being circumferentially compressed and being resiliently urged against wall portions of the cavity thereby retaining the contact terminal in the cavity,
    the first band having one circumferential edge which is relatively proximate to the first surface and a second circumferential edge which is relatively remote from the first surface, the contact arms extending in cantilever fashion from the second circumferential edge directly towards the second band and inwardly, the contact arms having free ends and having contact portions on their free ends,
    the strap having an inwardly formed portion intermediate its ends at a location adjacent to the contact portions of the arms, the inwardly formed portion constituting a contact portion and serving to locate the first band concentrically with respect to the pin receiving opening and to locate the first band in spaced relationship to the surface of the uniform diameter portion of the cavity whereby, upon insertion of a contact pin through the pin receiving opening, through the first band and past the contact portions of the contact arms and the strap, the pin will contact the contact portions, and the first band will be moved laterally, in the event of misalignment of the first band and the pin, and the first band will thereby be brought into alignment with the pin.

5. A one piece stamped and formed sheet metal socket contact terminal which is contained in a cavity in a housing as set forth in claim 4 characterized in that the housing is the housing of an electrical socket connector for interconnecting a pin grid array to a printed circuit board, the housing having a plurality of cavities therein, each cavity having a contact terminal therein.

* * * * *